United States Patent [19]
Tomiyama

[11] Patent Number: 5,838,184
[45] Date of Patent: Nov. 17, 1998

[54] EQUIVALENT VARIABLE RESISTOR CIRCUITS

[75] Inventor: Hitoshi Tomiyama, Kanagawa, Japan

[73] Assignee: Sony Corporation, Tokyo, Japan

[21] Appl. No.: 861,198

[22] Filed: May 21, 1997

[30] Foreign Application Priority Data

May 24, 1996 [JP] Japan ................................. 8-129695

[51] Int. Cl.$^6$ ........................................................ H03L 5/00
[52] U.S. Cl. ........................................ 327/308; 327/306
[58] Field of Search .................................. 327/306, 308, 327/524, 563

[56] References Cited

U.S. PATENT DOCUMENTS 5,300,834   4/1994   Bret ............................................ 307/570

Primary Examiner—Timothy P. Callahan
Assistant Examiner—Jeffrey Zweizig
Attorney, Agent, or Firm—Jay H. Maioli

[57] ABSTRACT

An equivalent variable resistor circuit for use in an integrated circuit includes a signal path extending from a signal input terminal through a first resistor to a signal output terminal, a first transistor having its collector connected with a signal output portion of the signal path between the first resistor and the signal output terminal, a second transistor having its collector connected with a DC voltage source and its emitter connected with an emitter of the first transistor for forming a differential pair with the first transistor, a third transistor having its collector connected with the emitters of the first and second transistors connected with each other and its emitter connected through a second resistor to a reference potential point to form a voltage to current converting portion with the second resistor, and a voltage controlling portion provided for varying a DC voltage supplied between bases of the first and second transistors, so as to vary equivalently a resistance of the signal path between the signal input terminal and the signal output terminal.

10 Claims, 3 Drawing Sheets

EQUIVALENT VARIABLE RESISTOR CIRCUITS

BACKGROUND OF THE INVENTION

1. Field of the Invention

The present invention relates to equivalent variable resistor circuits, and more particularly to an equivalent variable resistor circuit used, for example, as an elemental circuitry for constituting a filter which is provided in a signal receiving apparatus for selecting an intermediate frequency signal based on a broadcasting signal received by the signal receiving apparatus.

2. Description of the Prior Art

In the field of super heterodyne receivers used for receiving frequency-modulated or amplitude-modulated broadcasting signals transmitted from so-called radio broadcasting stations, there has been generally employed a digital tuning system wherein, for example, a phase-locked loop (PLL) is utilized in place of an analog tuning system wherein a variable capacitor is used. In the super heterodyne receiver in which the digital tuning system is employed, the phase-locked loop works under the control of a microcomputer to carry out a rapid and exact tuning operation and manual adjustments by a user are not necessary so that a tuning portion easy to use is constituted.

In the super heterodyne receiver employing the digital tuning system, a broadcasting signal selectively received during a tuning operation conducted by the digital tuning system is frequency-converted to be an intermediate frequency signal and the intermediate frequency signal thus obtained is subjected to elimination of spurious signals contained therein and then supplied to an intermediate frequency amplifier, in the same manner as a broadcasting signal received and processed in the super heterodyne receiver employing the analog tuning system. Therefore, an intermediate frequency filter which is operative to select the intermediate frequency signal is provided for the elimination of spurious signals also in the super heterodyne receiver employing the digital tuning system.

A previously proposed intermediate frequency filter provided in the super heterodyne receiver employing the digital tuning system is often composed of a ceramic filter element which is superior in frequency stability, so as to make the best use of advantages of quick and sure tuning operations brought about by the digital tuning system. The intermediate frequency filter composed of the ceramic filter element raises little variations in frequency selected thereby under a normal and proper use thereof and therefore there is an advantage that manual adjustments by a user are not necessary.

However, it is generally difficult to miniaturize the ceramic filter element or reduce the ceramic filter element in thickness and the ceramic filter element is relatively expensive. Accordingly, although a tuning portion by which a digital tuning operation is carried out, a frequency converting portion, an intermediate frequency processing portion and so on are usually formed into an integrated circuit so as to be miniaturized and lightened in the super heterodyne receiver employing the digital tuning system, the intermediate frequency filter which is composed of the ceramic filter element is not contained in the integrated circuit but provided at the outside of the integrated circuit to be connected with the same. This results in an obstruction to miniaturization of the whole circuit including the tuning portion, frequency converting portion, intermediate frequency processing portion and so on. Further, the cost of the super heterodyne receiver employing the digital tuning system is undesirably increased by the use of the intermediate frequency filter which is composed of the ceramic filter element.

Under such a situation, it is desired for the super heterodyne receiver employing the digital tuning system to have an intermediate frequency filter which is provided with a circuit structure suitable to be formed into an integrated circuit, instead of the ceramic filter element, and to be able to make the best use of the advantages of quick and sure tuning operations brought about by the digital tuning system. However, in a previously proposed super heterodyne receiver employing the digital tuning system in which the intermediate frequency filter which is formed into the integrated circuit without the ceramic filter element is provided, there is still a problem that a center frequency of the intermediate frequency filter is undesirably varied. The undesirable variations in the center frequency of the intermediate frequency filter results mainly from lack of uniformity in characteristic of each of semiconductor circuit elements constituting the intermediate frequency filter suitable to be formed into the integrated circuit and it is difficult to provide appropriately the semiconductor circuit elements with characteristic correction or characteristic compensation in response to the lack of uniformity in their characteristic because the semiconductor circuit elements are contained in the integrated circuit. Therefore, the undesirable variations in the center frequency of the intermediate frequency filter which is formed into the integrated circuit can not be effectively suppressed.

OBJECTS AND SUMMARY OF THE INVENTION

Accordingly, it is an object of the present invention to provide an equivalent variable resistor circuit which is suitable to be used as an elemental circuitry for constituting an intermediate frequency filter which is formed into an integrated circuit in a signal receiving apparatus for selecting an intermediate frequency signal based on a broadcasting signal received by the signal receiving apparatus.

Another object of the present invention is to provide an equivalent variable resistor circuit which is suitable to be used as an elemental circuitry for constituting an intermediate frequency filter which is formed into an integrated circuit in a signal receiving apparatus for selecting an intermediate frequency signal based on a broadcasting signal received by the signal receiving apparatus and can be obtained at a relatively low price.

A further object of the present invention is to provide an equivalent variable resistor circuit for use in a signal receiving apparatus to constitute an intermediate frequency filter formed into an integrated circuit for selecting an intermediate frequency signal based on a broadcasting signal received by the signal receiving apparatus, with which adjustment for suppressing undesirable variations in a center frequency of the intermediate frequency filter formed into the integrated circuit can be easily and appropriately carried out.

According to the present invention, there is provided an equivalent variable resistor circuit comprising a signal path extending from a signal input terminal through a first resistor to a signal output terminal, a first transistor having a first electrode, which is, for example, a collector, connected with a signal output portion of the signal path between the first resistor and the signal output terminal, a second transistor having a first electrode, which is, for example, a collector, connected with a DC voltage source, and a second electrode, which is, for example, an emitter, connected with a second electrode, which is, for example, an emitter, of the first transistor for forming a differential pair with the first transistor, a third transistor having a first electrode, which is, for example, a collector, connected with the second electrodes of the first and second transistors connected with each other and a second electrode, which is, for example, an emitter, connected through a second resistor to a reference potential point to form a voltage to current converting portion with the second resistor, and a voltage controlling portion provided for varying a DC voltage supplied between a third electrode, which is, for example, a base, of the first transistor and a third electrode, which is, for example, a base, of the second transistor, so as to vary equivalently a resistance of the signal path between the signal input terminal and the signal output terminal.

In an embodiment of equivalent variable resistor circuit according to the present invention, the voltage controlling portion which is provided for varying the DC voltage supplied between the third electrode of the first transistor and the third electrode of the second transistor comprises a constant DC voltage source for supplying the third electrode of the first transistor with a constant DC voltage and a variable DC voltage source for supplying the third electrode of the second transistor with a variable DC voltage.

As described above, the equivalent variable resistor circuit according to the present invention comprises a plurality of resistors, a plurality of transistors including the first and second transistors, and the voltage controlling portion which includes, for example, the constant DC voltage source for supplying the third electrode of the first transistor with the constant DC voltage and the variable DC voltage source for supplying the third electrode of the second transistor with the variable DC voltage and is operative to vary the DC voltage supplied between the third electrodes of the first and second transistors. The equivalent variable resistor circuit thus constituted is provided with a circuit structure which is suitable to be formed into an integrated circuit and able to be obtained at a relatively low price.

In the equivalent variable resistor circuit according to the present invention, when the DC voltage supplied between the third electrodes of the first and second transistors is varied by the voltage controlling portion, the resistance of the signal path between the signal input terminal and the signal output terminal is varied in response to variations in the DC voltage supplied between the third electrodes of the first and second transistors. Therefore, under a condition wherein the equivalent variable resistor circuit according to the present invention is used as an elemental circuitry for constituting an intermediate frequency filter which is formed into an integrated circuit in a signal receiving apparatus for selecting an intermediate frequency signal based on a broadcasting signal received by the signal receiving apparatus, a resistance of a part of a signal path formed in the intermediate frequency filter is varied when the DC voltage supplied between the third electrodes of the first and second transistors is varied by the voltage controlling portion.

Accordingly, under a condition wherein the equivalent variable resistor circuit according to the present invention is used to form a resistive portion participating in determination of a center frequency of the intermediate frequency filter, when the DC voltage supplied between the third electrodes of the first and second transistors is varied by the voltage controlling portion, a resistance of the resistive portion participating in determination of the center frequency of the intermediate frequency filter is varied, so that the center frequency of the intermediate frequency filter is varied in response to variations in the DC voltage supplied between the third electrodes of the first and second transistors. The variations in the center frequency of the intermediate frequency filter thus raised makes it possible to adjust the center frequency of the intermediate frequency filter for suppressing undesirable variations therein.

That is, under the condition wherein the equivalent variable resistor circuit according to the present invention is used to form the resistive portion participating in determination of the center frequency of the intermediate frequency filter which is formed into the integrated circuit, adjustment for suppressing undesirable variations in the center frequency of the intermediate frequency filter can be easily and appropriately carried out by means of varying the resistance of the signal path between the signal input terminal and the signal output terminal of the equivalent variable resistor circuit according to the present invention. Therefore, the equivalent variable resistor circuit according to the present invention is suitable to be used as the elemental circuitry for constituting the intermediate frequency filter which is formed into the integrated circuit.

The above, and other objects, features and advantages of the present invention will become apparent from the following detailed description taken in conjunction with the accompanying drawings.

DESCRIPTION OF THE PREFERRED EMBODIMENTS

Figure 1:
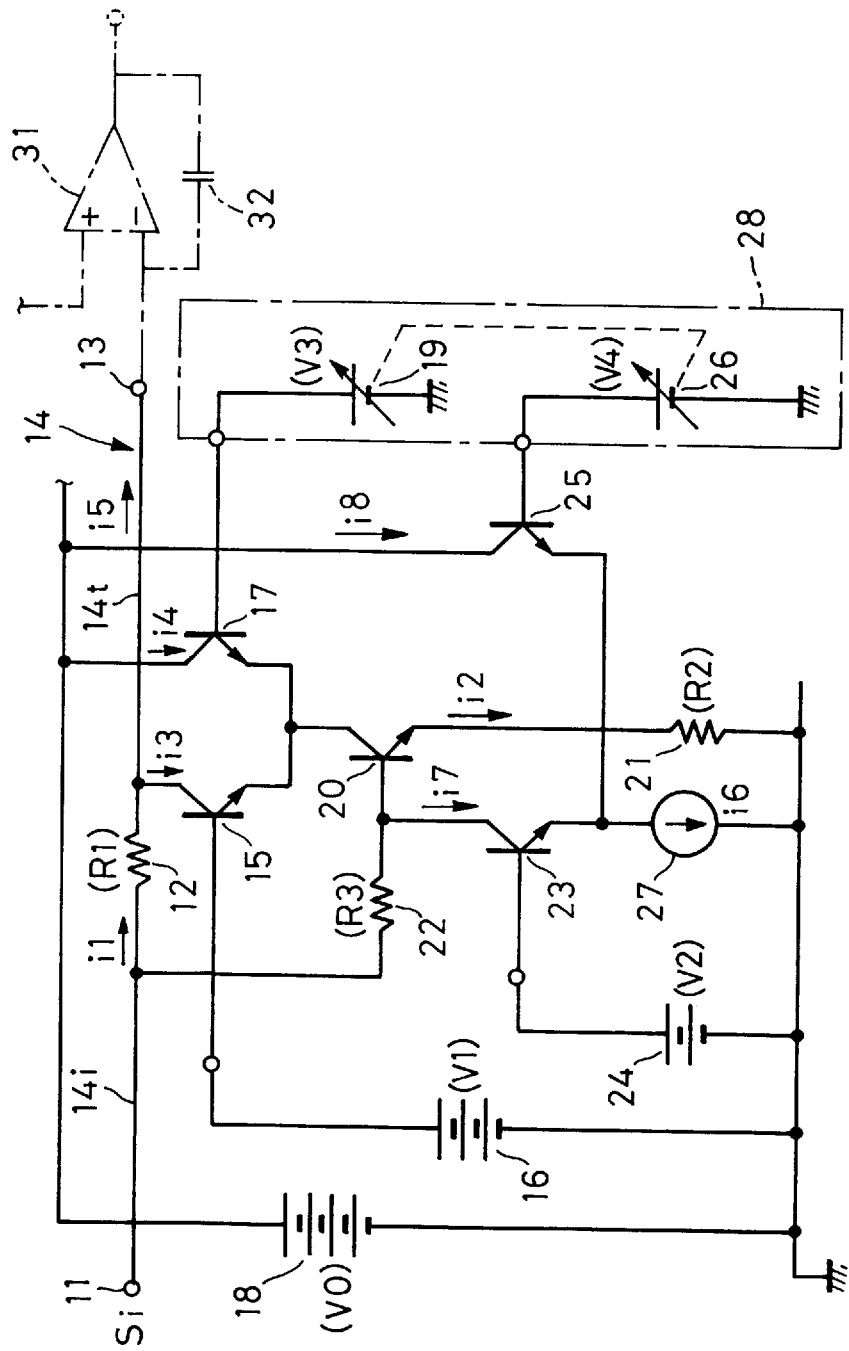
FIG. 1 is a circuit diagram showing an embodiment of the equivalent variable resistor circuit according to the present invention.

FIG. 1 shows an embodiment of the equivalent variable resistor circuit according to the present invention.

Referring to FIG. 1, a signal path 14 extending from a signal input terminal 11, to which an input signal Si is supplied, through a resistor 12 to a signal output terminal 13 is provided. The signal path 14 has a signal input portion 14i defined between the signal input terminal 11 and the resistor 12 and a signal output portion 14t defined between the resistor 12 and the signal output terminal 13.

A collector of a transistor 15 of the NPN type is connected with the signal output portion 14t of the signal path 14. A base of the transistor 15 is connected with a constant DC voltage source 16 for supplying with a constant DC voltage and an emitter of the transistor 15 is connected with an emitter of a transistor 17 of the NPN type. A collector of the transistor 17 is connected with a DC voltage source 18 and a base of the transistor 17 is connected with a variable DC voltage source 19 for supplying a variable DC voltage. The transistors 15 and 17 form a differential pair having the respective emitters connected with each other.

A collector of a transistor 20 of the NPN type is connected with the emitters of the transistors 15 and 17 connected with each other. An emitter of the transistor 20 is connected through a resistor 21 to a reference potential point (a grounded point) and a base of the transistor 20 is connected through a resistor 22 with the signal input portion 14i of the signal path 14. The transistor 20 and the resistor 21 form a voltage to current converting portion.

A collector of a transistor 23 of the NPN type is connected with the base of the transistor 20. A base of the transistor 23 is connected with a constant DC voltage source 24 for supplying with a constant DC voltage and an emitter of the transistor is connected an emitter of a transistor 25 of the NPN type. A collector of the transistor 25 is connected with the DC voltage source 18 and a base of the transistor 25 is connected with a variable DC voltage source 26 for supplying with a variable DC voltage. The transistors 23 and 25 form a differential pair having the respective emitters connected with each other. A current source 27 is connected with the emitters of the transistors 23 and 25 connected with each other.

The constant DC voltage source 16 supplying the base of the transistor 15 with the constant DC voltage and the variable DC voltage source 19 supplying the base of the transistor 17 with the variable DC voltage in the aggregate form a voltage controlling portion which is operative to vary a DC voltage supplied between the base of the transistor 15 and the base of the transistor 17 as occasion demands. Similarly, the constant DC voltage source 24 supplying the base of the transistor 23 with the constant DC voltage and the variable DC voltage source 26 supplying the base of the transistor 25 with the variable DC voltage in the aggregate form a voltage controlling portion which is operative to vary a DC voltage supplied between the base of the transistor 23 and the base of the transistor 25 as occasion demands.

The variable DC voltage source 19 and the variable DC voltage source 26 in the aggregate form a control voltage supplying portion 28 in which the variable DC voltage from the variable DC voltage source 19 is varied simultaneously with variations in the variable DC voltage from the variable DC voltage source 26.

The operation of the embodiment thus constituted as shown in FIG. 1 will be explained below on the assumption that an operational amplifier 31 and a capacitor 32 are connected in parallel with the signal output terminal 13. In this explanation, R1, R2 nd R3 represent resistance of the resistor 12, resistance of the resistor 21 and resistance of the resistor 22, respectively; V0 represents the DC voltage from the DC voltage source 18 (for example, 2 V); V1 represents the constant DC voltage from the constant DC voltage source 16 (for example, 1.65 V); V2 represents the constant DC voltage from the constant DC voltage source 24 (for example, 1.25 V); V3 represents the variable DC voltage from the variable DC voltage source 19; and V4 represents the variable DC voltage from the variable DC voltage source 26.

The input signal Si which is supplied to the signal input terminal 11 produces a current i1 flowing through the resistor 12 in the signal path 14 and is supplied through the resistor 22 to the base of the transistor 20. The transistor 20 and the resistor 21 which form the voltage to current converting portion produce a current i2 flowing through a collector-emitter path of the transistor 20 and the resistor 21.

The current i2 which flows through the collector-emitter path of the transistor 20 and the resistor 21 also flows separately through a collector-emitter path of the transistor 15 as a current i3 and through a collector-emitter path of the transistor 17 as a current i4 (i2=i3+i4). Therefore, a current i5 which is produced by subtracting the current i3 from the current i1 (i5=i1−i3) flows through the signal output portion of the signal path 14 between the collector of the transistor 15 and the signal output terminal 13. The current i5 flows through the signal output terminal 13 into the capacitor 32.

Under such a condition, when the variable DC voltage V3 supplied from the variable DC voltage source 19 to the base of the transistor 17 is varied, the DC voltage supplied between the base of the transistor 17 and the base of the transistor 15 to which the constant DC voltage V1 is supplied from the constant DC voltage source 16 is varied so that the base potential of the transistor 17 with reference to the base potential of the transistor 15 is varied. As a result, a ratio $\alpha$ of the current i4 flowing through the collector-emitter path of the transistor 17 to the current i3 flowing through the collector-emitter path of the transistor 15 ($\alpha$=i4/i3) is changed.

Since the current i2 flowing through the collector-emitter path of the transistor 20 is kept constant, each of the current i3 flowing through the collector-emitter path of the transistor 15 and the current i4 flowing through the collector-emitter path of the transistor 17 is varied, so that the current i5 flowing through the signal output terminal 13 into the capacitor 32 is varied. In such a manner, the current i5 flowing through the signal output terminal 13 into the capacitor 32 is varied in response to variations in the variable DC voltage V3 supplied from the variable DC voltage source 19 to the base of the transistor 17. This means that a resistance of the signal path 14 from the signal input terminal 11 to the signal output terminal 13 is equivalently varied in response to the variations in the variable DC voltage V3 supplied from the variable DC voltage source 19 to the base of the transistor 17 and consequently the embodiment shown in FIG. 1 functions as a variable resistor.

On the supposition that vi represents a voltage of the input signal Si, the current i1 flowing through the resistor 12 and the current i2 flowing through the resistor 21 are expressed as follows.

$$i1=vi/R1$$

$$i2=vi/R2$$

There is the following relation among the current i2 flowing through the resistor 21, the current i3 flowing through the collector-emitter path of the transistor 15, and the current i4 flowing through the collector-emitter path of the transistor 17.

$$i2=i3+i4$$

$$=i3+\alpha \cdot i3$$

$$=(1+\alpha) \cdot i3$$

Therefore, the current i3 flowing through the collector-emitter path of the transistor 15 is expressed as follows.

$$i3=i2/(1+\alpha)$$

$$=\gamma \cdot i2 (\gamma=1/(1+\alpha)$$

The current i5 flowing through the signal output terminal 13 into the capacitor 32 is expressed as follows.

$$\begin{aligned} i5 &= i1 - i3 \\ &= i1 - \gamma \cdot i2 \\ &= vi/R1 - \gamma \cdot vi/R2 \\ &= vi \cdot (R2 - \gamma \cdot R1)/(R1 \cdot R2) \end{aligned}$$

Accordingly, on the assumption that Rx represents an equivalent resistor of the signal path 14 from the signal input terminal 11 to the signal output terminal 13, the equivalent resistor Rx is represented as follows.

$$Rx = vi/i5$$
$$= (R1 \cdot R2)/(R2 - \gamma \cdot R1)$$

That is, when the embodiment shown in FIG. 1 functions as a variable resistor, the equivalent resistor RX=(R1·R2)/(R2−γ·R1) which varies in response to variations in γ=1/(1+α), and therefore, in response to variations in the ratio α of the current i4 to the current i3 (α=i4 /i3).

In the embodiment shown in FIG. 1, on the assumption that i6 represents a current flowing through the current source 27, i7 represents a current flowing through a collector-emitter path of the transistor 23, and i8 represents a current flowing through a collector-emitter path of the transistor 25, since the current i6 flows separately through the collector-emitter path of the transistor 23 as the current i7 and through the collector-emitter path of the transistor 25 as the current i4, the following relation is satisfied.

$$i6=i7+i8$$

The variable DC voltage V4 supplied from the variable DC voltage source 26 to the base of the transistor 25 is varied simultaneously with variations in the variable DC voltage V3 supplied from the variable DC voltage source 19 to the base of the transistor 17, and thereby a difference between the voltage V3 and the voltage V1 supplied from the constant DC voltage source 16 to the base of the transistor 15 and a difference between the voltage V4 and the voltage V2 supplied from the constant DC voltage source 24 to the base of the transistor 23 are controlled to be equal to each other so as to be ΔV (ΔV=V3−V1=V4−V2).

Accordingly, a ratio of the current i8 flowing through the collector-emitter path of the transistor 25 to the current i7 flowing through the collector-emitter path of the transistor 23 is equal to the ratio α of the current i4 flowing through the collector-emitter path of the transistor 17 to the current i3 flowing through the collector-emitter path of the transistor 15, and therefore there is the following relation among the current i6 flowing through the current source 27 and the current i7 flowing through the collector-emitter path of the transistor 23.

$$i7=i6/(1+\alpha)=\gamma \cdot i6$$

Further, in the embodiment shown in FIG. 1, a voltage drop raised at the resistor 12 by the current i3 flowing therethrough, which is represented as i3·R1=γ·i2·R2, and a voltage drop raised at the resistor 22 by the current i7 flowing therethrough, which is represented as i7·R3= γ·i6·R3, are arranged to be equal to each other (γ·i2·R2= γ·i6·R3).

Under such a condition, when the variable DC voltage V3 supplied from the variable DC voltage source 19 to the base of the transistor 17 is varied, the DC voltage (ΔV) supplied between the base of the transistor 17 and the base of the transistor 15 to which the constant DC voltage V1 supplied from the constant DC voltage source 16 is varied in accordance with the variations in the variable DC voltage V3. Accordingly, the ratio α of the current i4 flowing through the collector-emitter path of the transistor 17 to the current i3 flowing through the collector-emitter path of the transistor 15 is varied so that the current i3 is varied. Consequently, the voltage drop raised at the resistor 22 by the current i3 flowing therethrough is varied and a voltage potential at the signal input portion 14i of the signal path 14 is varied.

At this time, since the variable DC voltage V4 supplied from the variable DC voltage source 26 to the base of the transistor 25 is also varied simultaneously with the variations in the variable DC voltage V3, the DC voltage (ΔV) supplied between the base of the transistor 25 and the base of the transistor 23 to which the constant DC voltage V2 supplied from the constant DC voltage source 24 is varied in accordance with the variations in the variable DC voltage V4. Accordingly, the ratio α of the current i8 flowing through the collector-emitter path of the transistor 25 to the current i7 flowing through the collector-emitter path of the transistor 23 is varied so that the current i7 is varied. Consequently, the voltage drop raised at the resistor 22 by the current i7 flowing therethrough is also varied.

Since the voltage drop raised at the resistor 12 by the current i3 flowing therethrough and the voltage drop raised at the resistor 22 by the current i7 flowing therethrough are arranged to be equal to each other, the variations in the voltage drop raised at the resistor 12 and the variations in the voltage drop raised at the resistor 22 are equal to each other. Therefore, when the voltage potential at the signal input portion 14i of the signal path 14 is varied in accordance with the variations in the voltage drop raised at the resistor 12, the variations in the voltage drop raised at the resistor 22 are absorbed by the variations in the voltage drop raised at the resistor 22 and the voltage potential at the base of the transistor 20 is not varied.

As described above, with the structure including the transistors 23 and 25 constituting the differential pair, the current source 27, the constant DC voltage source 24 supplying the base of the transistor 23 with the constant DC voltage V2, the variable DC voltage source 26 supplying the base of the transistor 25 with the variable DC voltage V4 and varying the variable DC voltage V4 simultaneously with the variations in the variable DC voltage V3 supplied to the base of the transistor 17 from the variable DC voltage source 19, which are arranged in such manners as described above, the voltage potential at the base of the transistor 20 is maintained to be substantially constant so that the equivalent resistance Rx of the signal path 14 from the signal input terminal 11 to the signal output terminal 13 is appropriately varied when the variable DC voltage V3 supplied from the variable DC voltage source 19 to the base of the transistor 17 is varied with intent to vary the equivalent resistance Rx.

Figure 2:
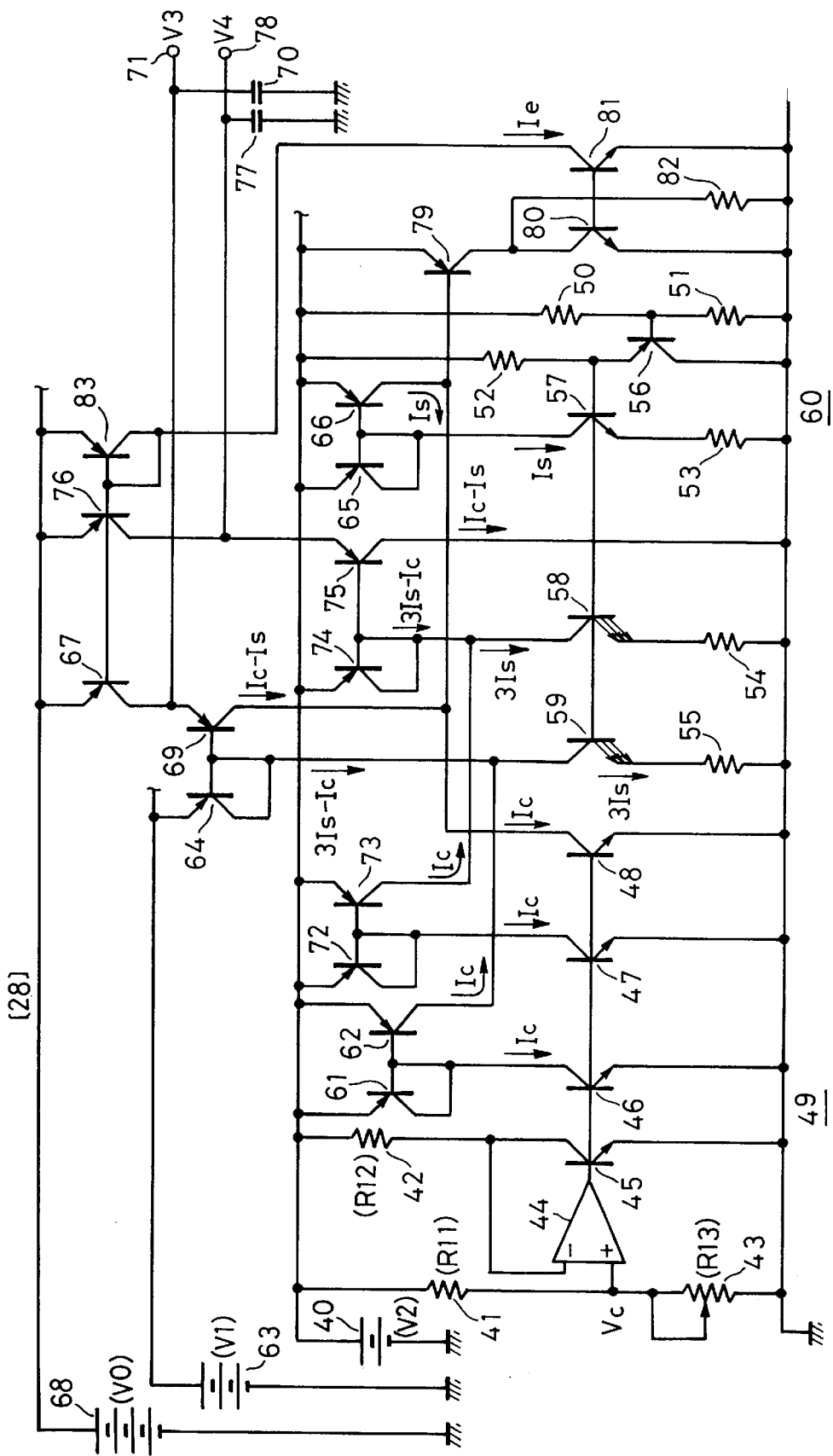
FIG. 2 is a circuit diagram showing an embodied example of a control voltage supplying portion employed in the embodiment shown in FIG. 1.

FIG. 2 shows an embodied example of the control voltage supplying portion 28 which includes the variable DC voltage source 19 and the variable DC voltage source 26 employed in the embodiment shown in FIG. 1.

Referring to FIG. 2, in a circuit portion to which a constant DC voltage source 40 for supplying with the constant DC voltage V2 (for example, 1.25 V) is connected to constitute a power source, a voltage to current converting portion 49 which comprises resistors 41 and 42, a variable resistor 43 for adjustment, an operational amplifier 44 and transistors 45, 46, 47 and 48 of the NPN type, and a current source portion 60 which comprises resistors 50, 51, 52, 53, 54 and 55, a transistor 56 of the PNP type and transistors 57, 58 and 59 of the NPN type and is operative to supply with a current suppressed in variations due to temperature variations, are provided.

In the voltage to current converting portion 49, a voltage Vc obtained at a connecting point between the resistor 41 and the variable resistor 43 is supplied to the operational amplifier 44 and a current Ic flowing through a collector-emitter path of each of the transistors 46, 47 and 48 so as to correspond to the voltage Vc supplied to the operational amplifier 44 results from an negative feedback operation carried out by a circuit portion including the operational amplifier 44, the transistor 45 and the resistor 42. The voltage Vc is varied in accordance with variations in resistance of the variable resistor 43. Accordingly, the variations in resistance of the variable resistor 43 causes the voltage Vc to vary and thereby causes further the current Ic flowing through the collector-emitter path of each of the transistors 46, 47 and 48 to vary. This means that the current Ic is a variable DC current varying in response to the variations in resistance of the variable resistor 43.

On the supposition that R11 represents resistance of the resistor 41, R12 represents resistance of the resistor 42 and R13 represents the resistance of the variable resistor 43, the current Ic is represented as follows.

$$Ic=V2 \cdot R11/((R11+R12) \cdot R13)$$

In the current source portion 60, each of the transistors 58 and 59 has an emitter area three times wider than the emitter area of the transistor 57 and therefore a current Is flows through a collector-emitter path of the transistor 57 and a current 3Is which is three times as large as the current Is flows through a collector-emitter path of each of the transistors 58 and 59. The current Is is a DC current smaller than the current Ic and the current 3Is is a DC current larger than the current Ic.

The current Ic flowing through the collector-emitter path of the transistors 46 further flows through a collector-emitter path of a transistor 61 of the PNP type, which forms a current mirror portion together with a transistor 62 of the PNP type, and therefore another current Ic flows through a collector-emitter path of the transistor 62. The current Ic flowing through the collector-emitter path of the transistor 62 further flows through a collector-emitter path of the transistor 59. Consequently, a current 3Is–Ic flows through an emitter-collector path of a transistor 64 of the PNP type which has its emitter connected to a constant DC voltage source 63 for supplying with the constant DC voltage V1 (for example, 1.65 V) and its collector connected to a collector of the transistor 59.

The current Is flowing through the collector-emitter path of the transistors 57 flows through an emitter-collector path of a transistor 65 of the PNP type, which forms a current mirror portion together with a transistor 66 of the PNP type, and therefore another current Is flows through an emitter-collector path of the transistor 66. The current Is flowing through the emitter-collector path of the transistor 66 further flows through the collector-emitter path of the transistor 48. Consequently, a current Ic–Is flows through an emitter-collector path of a transistor 69 of the PNP type which has its emitter connected through an emitter-collector path of a transistor 67 of the PNP type to a DC voltage source 68 for supplying with the DC voltage V0 (for example, 2V) and its collector connected to a collector of the transistor 48.

A capacitor 70 is connected between an emitter of the transistor 69 and the grounded point and a voltage output terminal 71 is connected to one end of the capacitor 70 connected with the emitter of the transistor 69. A variable DC voltage varying in response to the variations in the current Ic is obtained at the voltage output terminal 71. This variable DC voltage obtained at the voltage output terminal 71 is used as the variable DC voltage V3 supplied from the variable DC voltage source 19 in the embodiment shown in FIG. 1.

A circuit portion including the transistors 64 and 69 and the capacitor 70 connected with the emitter of the transistor 69, through which a difference current (3Is–Ic) corresponding to a difference between the current Ic obtained from the voltage to current converting portion 49 and the current 3Is obtained from the current source portion 60 and a difference current (Ic–Is) corresponding to a difference between the current Ic obtained from the voltage to current converting portion 49 and the current Is obtained from the current source portion 60 flow, constitutes a current to voltage converting portion producing the variable DC voltage V3 corresponding to the difference current (3Is–Ic) or (Ic–Is).

The current Ic flowing through the collector-emitter path of the transistor 47 flows through an emitter-collector path of a transistor 72 of the PNP type, which forms a current mirror portion together with a transistor 73 of the PNP type, and therefore another current Ic flows through an emitter-collector path of the transistor 73. The current Is flowing through the emitter-collector path of the transistor 73 further flows through the collector-emitter path of the transistor 58. Consequently, a current 3Is–Ic flows through an emitter-collector path of a transistor 74 of the PNP type which has its emitter connected with the constant DC voltage source 40 for supplying with the constant DC voltage V2 and its collector connected to a collector of the transistor 58.

The current (IC–Is) flows through a collector-emitter path of a transistor 75 of the PNP type which has its emitter connected through an emitter-collector path on a transistor 76 of the PNP type to the DC voltage source for supplying with the DC voltage V0 and its collector connected with the grounded point.

A capacitor 77 is connected between the emitter of the transistor 75 and the grounded potential point and a voltage output terminal 78 is connected to one end of the capacitor 77 connected with the emitter of the transistor 75. A variable DC voltage varying in response to the variations in the current Ic is obtained at the voltage output terminal 78. This variable DC voltage obtained at the voltage output terminal 78 is used as the variable DC voltage V4 supplied from the variable DC voltage source 26 in the embodiment shown in FIG. 1.

A circuit portion including the transistors 74 and 75 and the capacitor 77 connected with the emitter of the transistor 75, through which a difference current (3Is–Ic) corresponding to a difference between the current Ic obtained from the voltage to current converting portion 49 and the current 3Is obtained from the current source portion 60 and a difference current (Ic–Is) corresponding to a difference between the current Ic obtained from the voltage to current converting portion 49 and the current Is obtained from the current source portion 60 flow, constitutes a current to voltage converting portion producing the variable DC voltage V4 corresponding to the difference current (3Is–Ic) or (Ic–Is).

Although the current Ic–Is flows through the emitter-collector path of each of the transistors 69 and 75 under an appropriate condition as described above, it is feared that a current which is deviated from the current Ic–Is flows through the emitter-collector path of each of the transistors 69 and 75 when the DC voltage V0 supplied from the DC voltage source 68, for example. To avoid such fear, the current flowing through the emitter-collector path of each of the transistors 69 and 75 is automatically corrected to eliminate deviations from the current Ic–Is in the embodied example shown in FIG. 2.

In the embodied example shown in FIG. 2, a base of a transistor 79 of the PNP type is connected with a connecting point between the collector of the transistor 48 and the collector of the transistor 69 and the deviation from the current Ic–Is on the current flowing through the emitter-collector path of the transistors 69 is detected by the transistor 79. When the deviation from the current Ic–Is on the current flowing through the emitter-collector path of the transistor 69 is detected by the transistor 79, a detection output obtained from the transistor 79 causes a current Ie flowing through a collector-emitter path of a transistor 81 of the NPN type to vary. The transistor 81 constitutes a current control circuit portion together with a transistor 80 of the NPN type and a resistor 82.

The current Ie flowing through the collector-emitter path of the transistor 81 flows through an emitter-collector path of a transistor 83 of the PNP type having its emitter connected with the constant DC voltage source 68, its collector connected with a collector of the transistor 81 and its base connected with bases of the transistors 67 and 76. The transistors 83, 67 and 76 constitute a current mirror portion. Accordingly, the current Ie flowing through the emitter-collector path of the transistor 83 is varied in response to the detection output obtained from the transistor 79 when the current Ie flowing through the collector-emitter path of the transistor 81 is varied in response to the detection output obtained from the transistor 79. Consequently, the current flowing through the emitter-collector path of each of the transistors 67 and 76 is varied in response to the detection output obtained from the transistor 79.

The variations in the current flowing through the emitter-collector path of each of the transistors 67 and 76 in response to the detection output obtained from the transistor 79 are raised in such a manner as to cause the detection output obtained from the transistor 79 to be zero, that is, to cause the deviation from the current Ic–Is on the current flowing through the emitter-collector path of the transistor 67 and the emitter-collector path of the transistor 69 to be eliminated. As a result, each of the current flowing through the emitter-collector path of the transistor 69 and the current flowing through the emitter-collector path of the transistor 75 is maintained to be substantially coincident with the current Ic–Is.

In the manner described above, in the embodied example shown in FIG. 2, the variable DC voltage V3 is obtained at the voltage output terminal 71 and the variable DC voltage V4 is obtained at the voltage output terminal 78. Then, when the resistance (R13) of the variable resistor 43 is varied manually, for example, the current Ic obtained in the voltage-current converting portion 49 is varied in response to variations in the resistance of the variable resistor 43 and each of the variable DC voltage V3 obtained at the voltage output terminal 71 and the variable DC voltage V4 obtained at the voltage output terminal 78 is simultaneously varied in response to variations in the current Ic. Consequently, the variable DC voltage sources 19 and 26 in the embodiment shown in FIG. 1 are surely constituted with the embodied example shown in FIG. 2.

Figure 3:
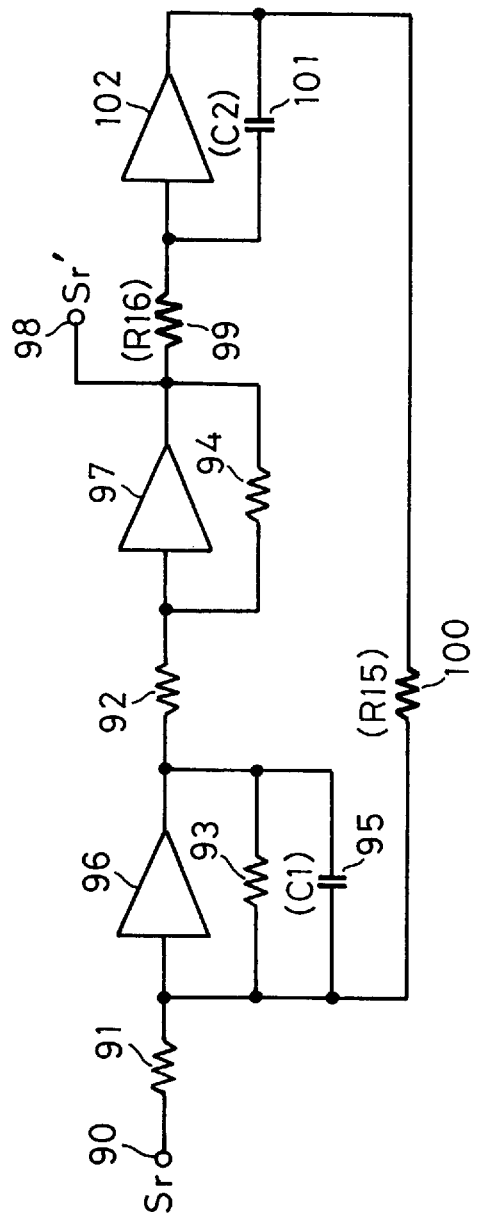
FIG. 3 is a circuit diagram showing an example of an intermediate frequency filter to which the embodiment shown in FIG. 1 is applied.

FIG. 3 shows a practical example of an intermediate frequency band pass filter which is provided with a circuit structure suitable to be formed into an integrated circuit for use in a super heterodyne receiver employing a digital tuning system, to which the embodiment of equivalent variable resistor circuit constituted in accordance with the present invention as shown in FIG. 1 is applied.

Referring to FIG. 3, a signal Sr supplied to an input terminal 90 is limited in frequency band by a frequency selecting portion comprising resistors 91, 92, 93 and 94, a capacitor 95 and operational amplifiers 96 and 97 and derived from the operational amplifier 97 to an output terminal 98 as a signal Sr'. Further, the signal Sr' obtained from the operational amplifier 97 is supplied through a feedback path portion constituted with variable resistors 99 and 100, a capacitor 101 and an operational amplifier 102 to an input end of the operational amplifier 96.

In the practical example of the intermediate frequency band pass filter shown in FIG. 3, a center frequency of the passing frequency band is set in accordance with a time constant determined by the resistance of the variable resistor 100 and the capacitance of the capacitor 95 and a time constant determined by the resistance of the variable resistor 99 and the capacitance of the capacitor 101. On the supposition that Fc represents the center frequency, R15 represents the resistance of the variable resistor 100, C1 represents the capacitance of the capacitor 95, R16 represents the resistance of the variable resistor 99 and C2 represents the capacitance of the capacitor 101, the following relation is satisfied.

$$Fc = 1/(2 \cdot \pi \cdot R15 \cdot C1) = 1/(2 \cdot \pi \cdot R16 \cdot C2)$$

This means that the center frequency Fc can be varied in accordance with variations in the resistance R15 of the variable resistor 100 and the resistance R16 of the variable resistor 99.

The embodiment of equivalent variable resistor circuit constituted in accordance with the present invention as shown in FIG. 1 is used for constituting equivalently each of the variable resistors 99 and 100 in the practical example of the intermediate frequency band pass filter shown in FIG. 3. In each embodiment of the equivalent variable resistor circuit, when the resistance (R13) of the variable resistor 43 in the embodied example shown in FIG. 2 is varied, the variable DC voltages V3 and V4 supplied respectively from the variable DC voltage sources 19 and 26 contained in the control voltage supplying portion 28 are varied and thereby the equivalent resistance Rx of the signal path 14 between the signal input terminal 11 and the signal output terminal 13 is varied. Under such a condition, the equivalent resistance Rx of the signal path 14 between the signal input terminal 11 and the signal output terminal 13 functions equivalently as each of the variable resistors 99 and 100 in the practical example of the intermediate frequency band pass filter shown in FIG. 3 and therefore the center frequency of the passing frequency band in the practical example of the intermediate frequency band pass filter shown in FIG. 3 is easily for appropriate adjustment in response to variations in the equivalent resistance Rx.

What is claimed is:

1. An equivalent variable resistor circuit comprising:
    a signal path extending from a signal input terminal through a first resistor to a signal output terminal;
    a first transistor having a first electrode connected with a signal output portion of said signal path between the first resistor and the signal output terminal;
    a second transistor having a first electrode connected with a DC voltage source and a second electrode connected with a second electrode of said first transistor for forming a differential pair with said first transistor;
    a third transistor having a first electrode connected with the second electrodes of said first and second transistors and a second electrode connected through a second resistor to a reference potential point to form a voltage to current converting portion with the second resistor; and
    a voltage controlling portion provided for varying a DC voltage supplied between a third electrode of said first transistor and a third electrode of said second transistor, whereby an equivalent resistance of said signal path between the signal input terminal and the signal output terminal is varied.

2. The equivalent variable resistor circuit according to claim 1, wherein said voltage controlling portion comprises:

a constant DC voltage source for supplying the third electrode of said first transistor with a constant DC voltage; and a variable DC voltage source for supplying the third electrode of said second transistor with a variable DC voltage.

3. The equivalent variable resistor circuit according to claim 1, wherein a third electrode of said third transistor is connected through a third resistor with a signal input portion of said signal path between the signal input terminal and the first resistor, and further comprising:

a fourth transistor having a first electrode connected with the third electrode of said third transistor and a second electrode connected through a current source to the reference potential point;

a fifth transistor having a first electrode connected with the DC voltage source and a second electrode connected with the second electrode of said fourth transistor for forming a differential pair with said fourth transistor; and an additional voltage controlling portion provided for varying a DC voltage supplied between a third electrode of said fourth transistor and a third electrode of said fifth transistor simultaneously with variations in the DC voltage supplied between the third electrode of said first transistor and the third electrode of said second transistor.

4. The equivalent variable resistor circuit according to claim 3, wherein said voltage controlling portion comprises:

a first constant DC voltage source for supplying the third electrode of said first transistor with a first constant DC voltage; and a first variable DC voltage source for supplying the third electrode of said second transistor with a first variable DC voltage, and wherein said additional voltage controlling portion includes:

a second constant DC voltage source for supplying the third electrode of said fourth transistor with a second constant DC voltage; and a second variable DC voltage source for supplying the third electrode of said fifth transistor with a second variable DC voltage, and wherein said first and second variable DC voltage sources are ganged with each other so that they vary simultaneously.

5. The equivalent variable resistor circuit according to claim 2, wherein said variable DC voltage source comprises:

a voltage to current converting portion including a variable resistor, and an operational amplifier for producing a variable DC current varying in response to variations in resistance of said variable resistor;

a current source for supplying a predetermined DC current; and a current to voltage converting portion for producing a variable DC voltage based on a current differential corresponding to a difference between the variable DC current produced by said voltage to current converting portion and the predetermined DC current produced by said current source.

6. The equivalent resistor circuit according to claim 5, wherein said current source is adapted to produce first and second DC currents different from each other, and said current to voltage converting portion comprises:

a fourth transistor through which a first current differential corresponding to a difference between the variable DC current produced by said voltage to current converting portion and said first DC current flows; and a fifth transistor through which a second current differential corresponding to a difference between the variable DC current produced by said voltage to current converting portion and said second DC current flows, wherein the variable DC voltage is produced based on one of said first and second current differentials.

7. The equivalent variable resistor circuit according to claim 6, further comprising a circuit portion adapted to perform a negative feedback operation for controlling the first and second DC currents produced by said current source in response to variations in one of the first and second current differentials flowing through one of said fourth and fifth transistors constituting said current to voltage converting portion, so that a ratio of the second current differential to the first current differential is kept constant.

8. The equivalent variable resistor circuit according to claim 4, wherein said first and second variable DC voltage sources comprises:

a voltage to current converting portion including a variable resistor, and an operational amplifier for producing first and second variable DC currents each varying in response to variations in resistance of said variable resistor;

a current source for supplying first and second DC currents;

a first current to voltage converting portion for producing a first variable DC voltage based on a first current differential corresponding to a difference between the first variable DC current produced by said voltage to current converting portion and the first DC current produced by said current source; and a second current to voltage converting portion for producing a second variable DC voltage based on a second current differential corresponding to a difference between the second variable DC current produced by said voltage to current converting portion and the second DC current produced by said current source.

9. The equivalent variable resistor circuit according to claim 8, wherein said voltage to current converting portion is adapted to produce a third variable DC current varying in response to the variations in resistance of said variable resistor, and said current source is adapted to produce a third DC current, and wherein said first current to voltage converting portion comprises a fourth transistor through which the first current differential flows and a fifth transistor through which a third current differential corresponding to a difference between the third variable DC current produced by said voltage to current converting portion and said third DC current flows, and said second current to voltage converting portion comprises sixth and seventh transistors each of which the second current differential flows through.

10. The equivalent variable resistor circuit to claim 9, further comprising a circuit portion adapted to perform a negative feedback operation for controlling the third DC current in response to variations in the third current differential flowing through said fifth transistor constituting said first current to voltage converting portion, so that a ratio of the third current differential to the first current differential is kept constant.

* * * * *